(12) United States Patent
Chen (10) Patent No.: US 9,899,190 B2
(45) Date of Patent: *Feb. 20, 2018

(54) METHOD AND APPARATUS FOR TRANSFERRING PIXEL DATA FOR ELECTRON BEAM LITHOGRAPHY

(71) Applicant: Taiwan Semiconductor Manufacturing Company, Ltd., Hsin-Chu (TW)

(72) Inventor: Yu-Chi Chen, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 15 days.

This patent is subject to a terminal disclaimer.

(21) Appl. No.: 14/639,786

(22) Filed: Mar. 5, 2015

(65) Prior Publication Data

US 2015/0179403 A1 Jun. 25, 2015

Related U.S. Application Data

(63) Continuation of application No. 14/088,667, filed on Nov. 25, 2013, now Pat. No. 8,975,601.

(51) Int. Cl.
| | |
|---|---|
| *H01J 37/317* | (2006.01) |
| *H01J 37/302* | (2006.01) |
| *H01J 37/147* | (2006.01) |
| *H01J 37/30* | (2006.01) |

(52) U.S. Cl.
CPC ........ *H01J 37/3174* (2013.01); *H01J 37/147* (2013.01); *H01J 37/3007* (2013.01); *H01J 37/3026* (2013.01); *H01J 37/3175* (2013.01); *H01J 2237/15* (2013.01); *H01J 2237/30472* (2013.01); *H01J 2237/3175* (2013.01); *H01J 2237/31762* (2013.01); *H01J 2237/31774* (2013.01); *H01J 2237/31789* (2013.01)

(58) Field of Classification Search
CPC ............. H01L 27/3295; H01L 29/4908; G02F 2001/136295; H01J 2237/30
USPC ......... 250/492.2, 492.22, 492.3, 396 R, 397; 438/487; 359/293

See application file for complete search history.

(56) References Cited

U.S. PATENT DOCUMENTS

| | | | |
|---|---|---|---|
| 5,838,119 A | 11/1998 | Engle | |
| 6,379,867 B1 | 4/2002 | Mei et al. | |
| 6,574,789 B1 * | 6/2003 | Yamauchi | H01J 37/3026 716/55 |
| 6,897,458 B2 * | 5/2005 | Wieland | B82Y 10/00 250/396 R |
| 7,141,340 B2 | 11/2006 | Bleeker | |
| 7,173,263 B2 | 2/2007 | Wieland et al. | |
| 8,464,186 B2 | 6/2013 | Wang et al. | |
| 8,468,473 B1 | 6/2013 | Wang et al. | |
| 8,473,877 B2 | 6/2013 | Wang et al. | |

(Continued)

Primary Examiner — Jason McCormack
Assistant Examiner — James Choi
(74) Attorney, Agent, or Firm — Haynes and Boone, LLP (57) ABSTRACT

A method of manufacturing a substrate is disclosed. The method includes receiving a plurality of pixel elements, wherein each of the pixel elements includes data members; and transferring the data members to a plurality of exposing devices that are configured to conditionally expose the substrate with an incident energy beam when coupled with the data members, wherein different data members of one pixel element are transferred at different system cycles.

20 Claims, 11 Drawing Sheets

(56) References Cited

U.S. PATENT DOCUMENTS

| | | |
|---|---|---|
| 8,507,159 B2 | 8/2013 | Wang et al. |
| 8,510,687 B1 | 8/2013 | Liu et al. |
| 8,524,427 B2 | 9/2013 | Shin et al. |
| 8,530,121 B2 | 9/2013 | Wang et al. |
| 8,563,224 B1 | 10/2013 | Chen et al. |
| 8,584,057 B2 | 11/2013 | Liu et al. |
| 8,601,407 B2 | 12/2013 | Wang et al. |
| 8,609,308 B1 | 12/2013 | Chen et al. |
| 8,627,241 B2 | 1/2014 | Wang et al. |
| 8,677,511 B2 | 3/2014 | Wang et al. |
| 8,762,900 B2 | 6/2014 | Shin et al. |
| 8,822,106 B2 | 9/2014 | Wang et al. |
| 8,828,632 B2 | 9/2014 | Wang et al. |
| 8,835,082 B2 | 9/2014 | Chen et al. |
| 8,835,929 B2 | 9/2014 | Xi et al. |
| 8,841,049 B2 | 9/2014 | Wang et al. |
| 8,846,278 B2 | 9/2014 | Shin et al. |
| 8,933,425 B1* | 1/2015 | Bevis .................... H01J 37/153 250/396 R |
| 8,969,836 B1* | 3/2015 | Chen ........................ 250/492.22 |
| 8,975,601 B1* | 3/2015 | Chen ........................ 250/492.22 |
| 2003/0031365 A1* | 2/2003 | Okuyama ............. G03F 7/2057 382/194 |
| 2003/0160191 A1* | 8/2003 | Nakai .................... B82Y 10/00 250/492.22 |
| 2006/0258068 A1* | 11/2006 | Moriya et al. ................. 438/158 |
| 2009/0114837 A1* | 5/2009 | Grella .................... B82Y 10/00 250/396 R |
| 2011/0235060 A1* | 9/2011 | Tai ........................ H04N 1/4015 358/1.1 |
| 2012/0194570 A1* | 8/2012 | Muto .................... G09G 3/344 345/690 |
| 2012/0229785 A1 | 9/2012 | Krivtsun et al. |
| 2012/0287410 A1* | 11/2012 | Wieland ................. B82Y 10/00 355/18 |
| 2013/0335720 A1 | 12/2013 | Takino et al. |
| 2014/0077211 A1* | 3/2014 | Xi et al. ........................... 257/59 |
| 2017/0034401 A1* | 2/2017 | Shiohara ................. H04N 5/04 |

\* cited by examiner

METHOD AND APPARATUS FOR TRANSFERRING PIXEL DATA FOR ELECTRON BEAM LITHOGRAPHY

This is a continuation application of U.S. patent application Ser. No. 14/088,667 entitled "METHOD AND APPARATUS FOR ELECTRON BEAM LITHOGRAPHY," filed Nov. 25, 2013, herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, electron beam (e-beam) technology is often used in the manufacture of semiconductor devices. In one example, a computer controlled electron pattern generator is used to direct an e-beam towards a semiconductor substrate coated with a layer of electron-sensitive resist (the target). The exposed portions of the resist are then developed and removed, thereby leaving a patterned resist layer on the semiconductor substrate as a mask for further lithographic processes. A common type of electron pattern generator uses an array of mirrors to deflect the e-beam in forming a gray-scale raster image on the target. The resolution of the image depends on the number of mirrors in the electron pattern generator. Generally, the more mirrors, the higher resolution of the image. As semiconductor process advances to nanometer (nm) range, there is a need to design such an electron pattern generator more efficiently.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
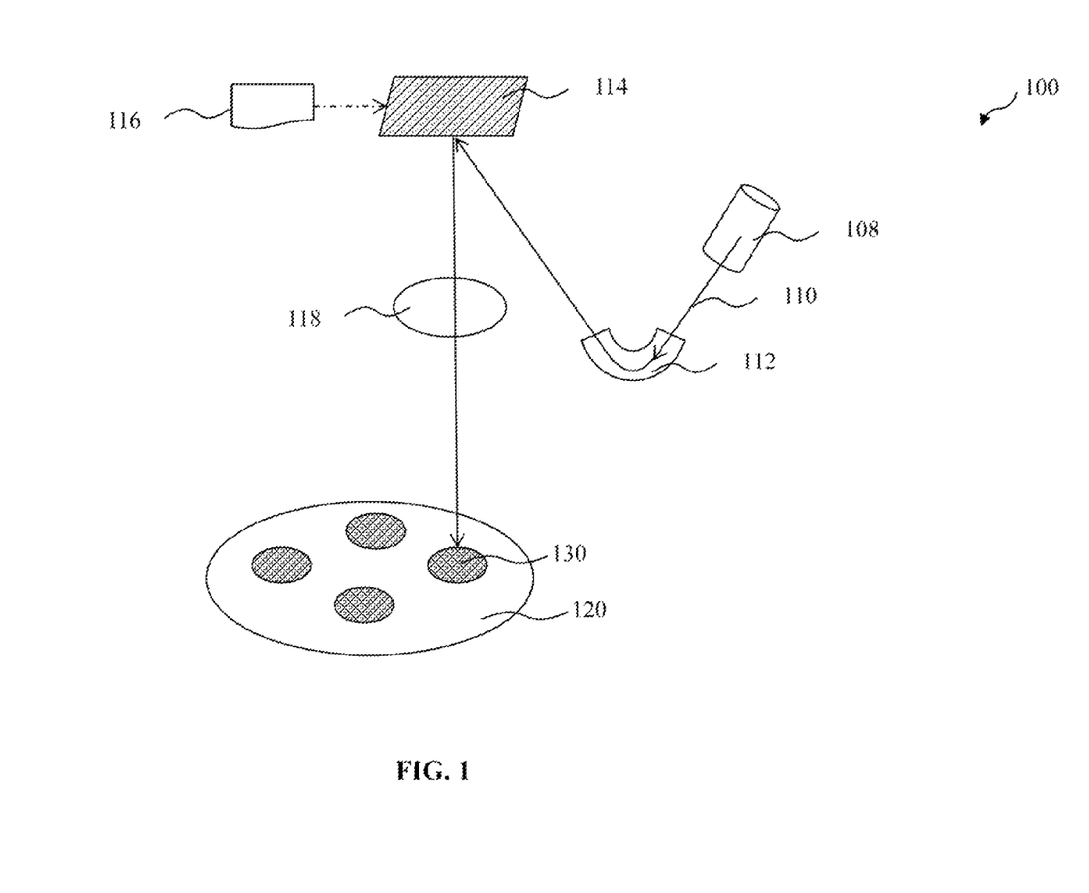
FIG. 1 is a simplified block diagram of an embodiment of an e-beam lithography system.

FIG. 1 illustrates an e-beam system 100 that may benefit from one or more aspects of the present disclosure. Referring to FIG. 1, the system 100 is capable of performing e-beam direct writing in manufacturing or repairing a plurality of wafers. The system 100 includes an electron source 108 which generates an e-beam 110, a beam-bender 112, a digital pattern generator (DPG) 114, a data file 116 as an input to the DPG 114, projection optics 118, and a rotary stage 120 which holds and aligns one or more semiconductor wafers 130 for proper exposure in manufacturing or repairing an integrated circuit (IC). The e-beam 110 may be a single e-beam or multiple e-beams.

The wafer 130 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The wafer 130 is coated with a photoresist layer prior to the exposure. The photoresist layer may be a positive type or a negative type. The wafer 130 may be cleaned before and/or soft-baked after the photoresist coating. The data file 116 is based on the design layout of the IC and is in a format accessible by the DPG 114. The DPG 114 either reflects or absorbs the e-beam 110 based on the data file 116 thereby only a portion of the photoresist layer over the wafer 130 is exposed for patterning the photoresist layer. After the exposure, further steps are conducted to form the IC or a portion thereof using a lithography process. For example, the wafer 130 may undergo post-exposure baking, developing, and hard-baking processes thereby forming patterns in the photoresist layer. The wafer 130 is etched using the patterned photoresist layer as an etch mask. The etching process may include dry etching, wet etching, or other etching techniques. The photoresist layer is subsequently stripped by a proper method such as wet stripping or plasma ashing. Further processes are performed to form various features onto the wafer 130, such as doped regions, dielectric features, and multilevel interconnects.

Figure 2A:
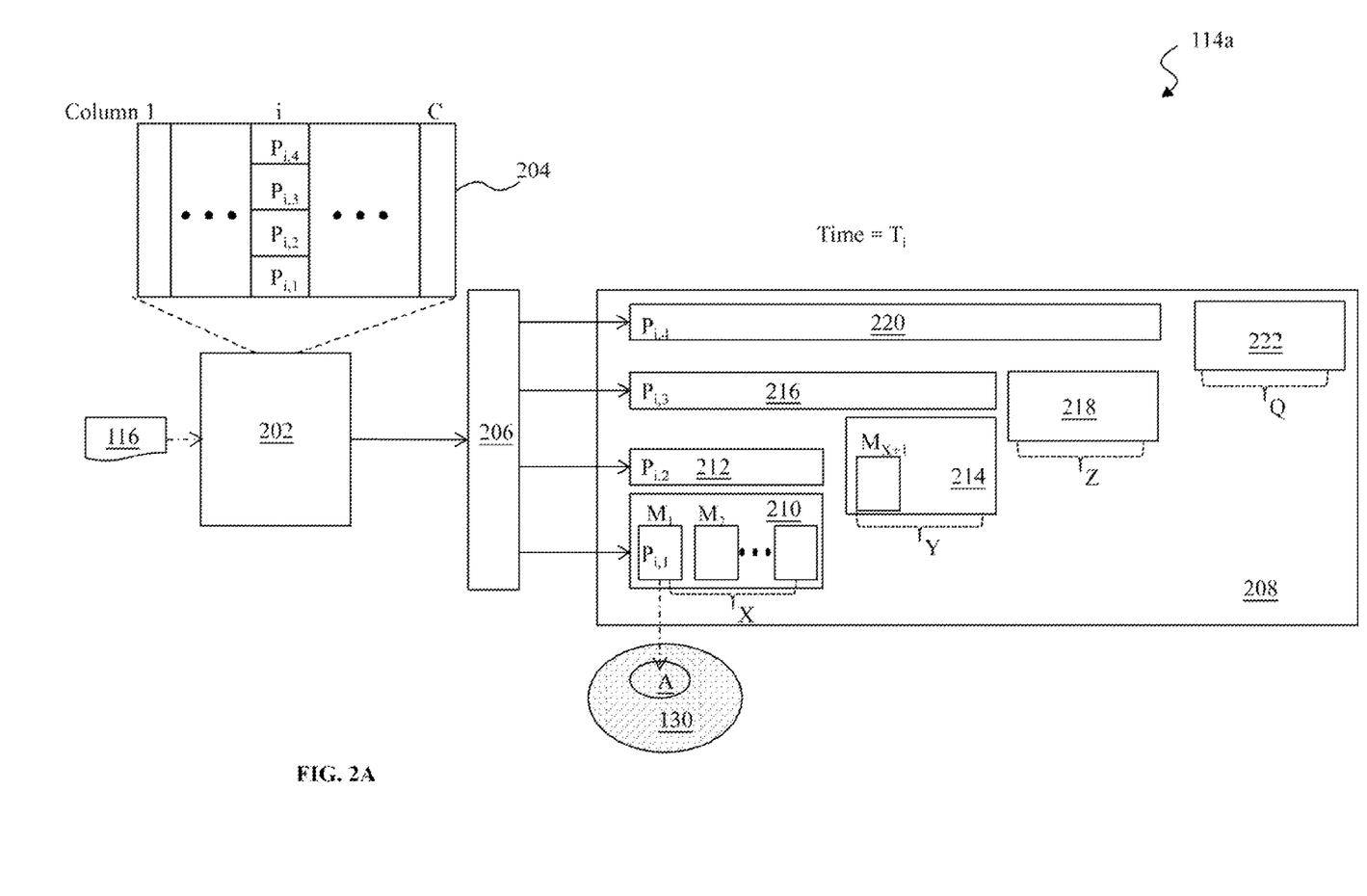
FIGS. 2A-2C show an exemplary digital pattern generator in the e-beam lithography system of FIG. 1, in accordance with an embodiment.
Figure 2B:
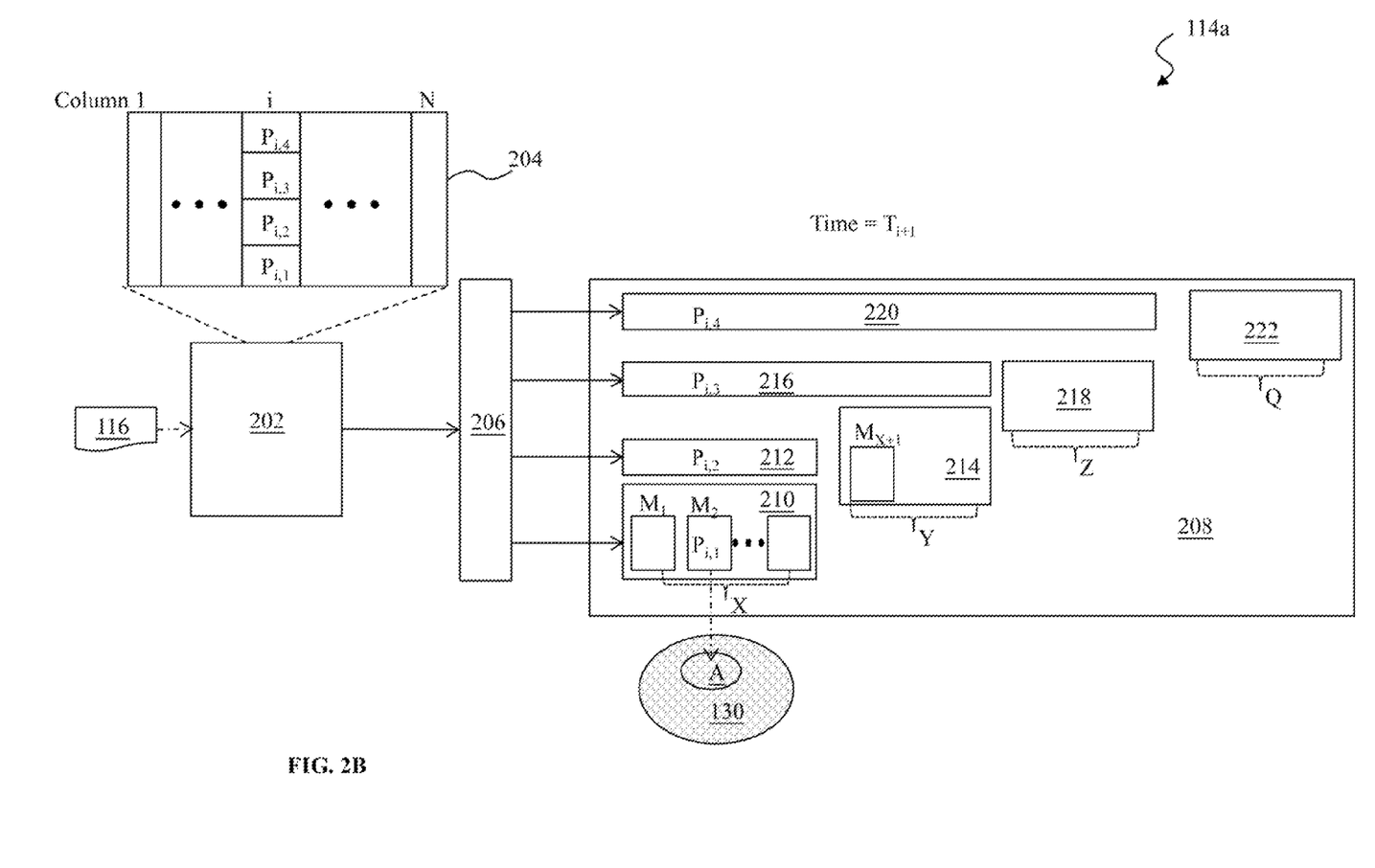
Figure 2C:
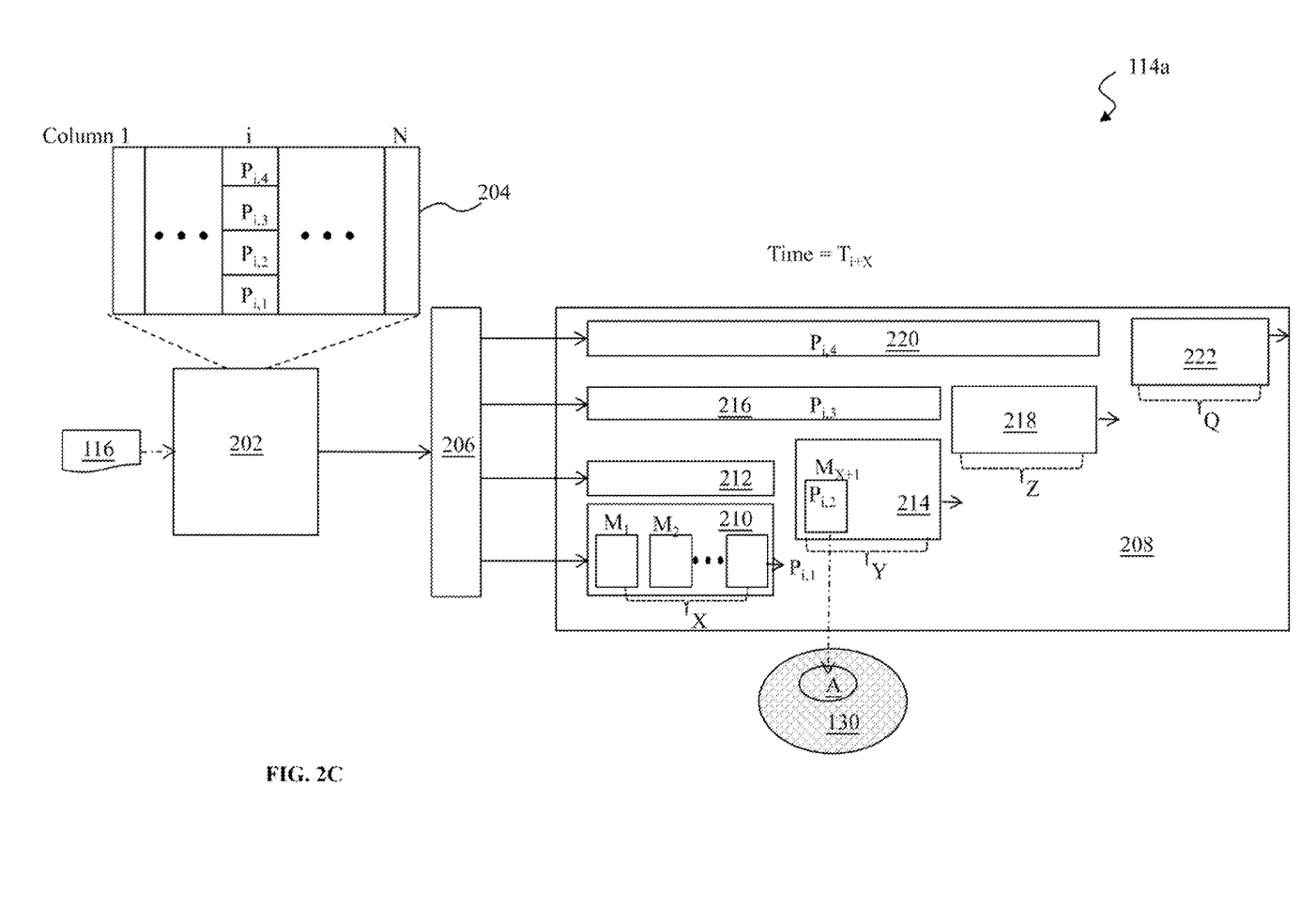

FIGS. 2A-2C illustrate a portion of a DPG 114a, which is an embodiment of the DPG 114 (FIG. 1). Referring to FIG. 2A, the DPG 114a includes a control system 202, an interface 206, and a mirror array 208. The control system 202 takes as input the data file 116 and converts it to a format accessible to the mirror array 208 in the course of exposing the wafer 130. In an embodiment, the control system 202 is a dedicated hardware system capable of executing a series of instructions. The dedicated hardware may include devices such as a field programmable gate array (FPGA), an application specific integrated circuit (ASIC), storage devices, and/or other peripheral devices, coupled by one or more system buses. The FPGA or ASIC devices may further include processing units and on-chip storage units. In an embodiment, the control system 202 is a computer system with a general purpose microprocessor, on-chip storage devices, and/or stand-alone storage devices, and other peripheral devices, executing a series of instructions for the tasks of the DPG 114a.

The control system 202 includes a bit map 204 which exists either on a physical storage device or as a sequence of computer executable instructions. It is understood that there are various ways to implement a bit map, including an array or grid of data values, or some other arrangement of data that identifies locations for later reference. The bit map 204 may be part of the data file 116 or may be generated by the control system 202 in response to the data file 116. In the present embodiment, the bit map 204 has C columns and N rows of bits which represent a portion of the lithography pattern to be exposed onto the wafer 130. For the sake of example, N equals 4 (four) in the present disclosure. Each of the C columns corresponds to one pixel of the image to be exposed (or printed). Within each column, each of the 4 bits corresponds to one pixel element of a pixel. In the following discussion, the four pixel elements of the i-th pixel (or the pixel "i") are denoted as $P_{i,1}$, $P_{i,2}$, $P_{i,3}$, and $P_{i,4}$, and the pixel "i" can be denoted as an ordered set $P_i = (P_{i,1}, P_{i,2}, P_{i,3}, P_{i,4})$, wherein $P_{i,1}$ is the first member of the ordered set $P_i$, $P_{i,2}$ the second member, $P_{i,3}$ the third member, and $P_{i,4}$ the fourth member.

The interface 206 couples the control system 202 to the mirror array 208. In an embodiment, the control system 202 presents one pixel a time to the interface 206. Alternatively, the control system 202 may present multiple pixels a time to the interface 206 in a batch mode. The interface 206 in turn transfers the pixel data to the mirror array 208, one pixel per a fixed interval, denoted as a "system cycle" in the present disclosure. In an embodiment, the control system 202 and the interface 206 are responsible for maintaining a constant throughput (e.g., number of pixels per second) feeding the mirror array 208. In an embodiment, the control system 202, the interface 206, and the mirror array 208 operate synchronously with one system clock. In another embodiment, the control system 202 and the mirror array 208 operate with different clocks and the interface 206 includes a clock-domain synchronization element such as a first-in first-out (FIFO).

The mirror array 208 includes N banks of e-beam mirrors. In the present disclosure, N=4, and the four banks of e-beam mirrors are banks 210, 214, 218, and 222. The number of e-beam mirrors in the banks 210, 214, 218, and 222 are X, Y, Z, and Q respectively. In an embodiment, X=4, Y=8, Z=16, and Q=32. Alternative configurations are possible. The e-beam mirrors in each bank is coupled in series such that a pixel element, such as $P_{i,1}$, passes from one mirror to the next per system cycle. In the present disclosure, each of the four pixel elements traverses e-beam mirrors in one of the four banks. Taking the pixel "i" as an example, the pixel element $P_{i,1}$ traverses all e-beam mirrors in the bank 210, $P_{i,2}$ traverses all e-beam mirrors in the bank 214, and so on. The mirror array 208 further includes delay elements 212, 216, and 220 for delaying the respective pixel element $P_{i,2}$, $P_{i,3}$, and $P_{i,4}$ so that they will expose the same spot on the wafer 130 as the pixel element $P_{i,1}$ does. To illustrate this point, FIG. 2A shows the pixel "i" reaches the mirror array 208 at the system cycle "i" (time $T_i$). Particularly, the pixel element $P_{i,1}$ reaches (or becomes operable to) a first e-beam mirror, $M_1$, in the bank 210, while the pixel elements $P_{i,2}$, $P_{i,3}$, and $P_{i,4}$ are in the delay elements 212, 216, and 220 respectively. FIG. 2A also shows that the wafer 130 is aligned with the mirror array 208 at the time $T_i$. Particularly, an area A of the wafer 130 is aligned with the first e-beam mirror, $M_1$. In an embodiment, if the pixel element $P_{i,1}$ is a logical "0," the e-beam mirror $M_1$ absorbs the e-beam 110 (FIG. 1). On the other hand, if the pixel element $P_{i,1}$ is a logical "1," the e-beam mirror $M_1$ reflects the e-beam 110 (FIG. 1) so that the area A is exposed to the e-beam 110. In another embodiment, the e-beam mirror $M_1$ absorbs the e-beam 110 if the pixel element $P_{i,1}$ is a logical "1," and reflects the e-beam 110 otherwise. The amount of exposure energy that the area A receives from the e-beam mirror $M_1$ depends on the energy dose of the e-beam 110 and the duration that the pixel element $P_{i,1}$ stays operable to the e-beam mirror $M_1$, among other factors.

FIG. 2B shows the DPG 114a and the wafer 130 at the next system cycle, the system cycle "i+1" (time=$T_{i+1}$). As shown in FIG. 2B, the pixel element $P_{i,1}$ advances to the next e-beam mirror, $M_2$, in the bank 210, while the pixel elements $P_{i,2}$, $P_{i,3}$, and $P_{i,4}$ also advance one step in the delay elements 212, 216, and 220 respectively. In an embodiment, the plurality of mirrors in each of the banks is connected like a shift registers and the pixel element $P_{i,1}$ shifts from the e-beam mirror $M_1$ to the e-beam mirror $M_2$ in response to a system clock. The wafer 130 moves in a "lock" step with the pixel "i," with the area A presently aligned with the e-beam mirror $M_2$. The area A is either exposed to the e-beam 110 (FIG. 1) or not, depending on the logical value of the pixel element $P_{i,1}$. If the area A is again exposed, the amount of exposure energy it receives from the e-beam mirror $M_2$ has a cumulative effect upon the area A. In another word, the total amount of exposure energy the area A receives during the system cycles $T_i$ and $T_{i+1}$, $E_{total}$, is a function of the amount of exposure energy, $E_1$ and $E_2$ that it receives from the e-beam mirrors $M_1$ and $M_2$ respectively. In an embodiment, $E_{total}$ is about equal to $(E_1+E_2)$.

FIG. 2C shows the DPG 114a and the wafer 130 at the system cycle "i+X" (time=$T_{i+x}$). As shown in FIG. 2C, after advancing in the delay element 212 for X cycles, the pixel element $P_{i,2}$ finally reaches (or becomes operable to) the first e-beam mirror in the bank 214, $M_{X+1}$. Also shown in FIG. 2C, the pixel elements $P_{i,3}$ and $P_{i,4}$ still stay inside the delay elements 216 and 220 respectively, while the pixel element $P_{i,1}$ has finished traversing all e-beam mirrors in the bank 210. In an embodiment, the pixel element $P_{i,1}$, shifting out of the last e-beam mirror of the bank 210, is used to monitor the integrity of the DPG 114a. For example, it can be used to check whether e-beam mirrors shift correctly by comparing the shifted-out value of $P_{i,1}$ with a predetermined value. The wafer 130 moves in a "lock" step with the pixel "i," with the area A presently aligned with the e-beam mirror $M_{X+1}$. The area A is either exposed to the e-beam 110 (FIG. 1) or not, depending on the logical value of the pixel element $P_{i,2}$. Any exposure by the e-beam mirror $M_{X+1}$ is cumulative as discussed above.

The pixel "i" advances in the mirror array 208 in the aforementioned manner until the pixel element $P_{i,4}$ has traversed all e-beam mirrors in the bank 222. For the sake of simplicity, assuming that each e-beam mirror reflects the e-beam 110 (FIG. 1) when the pixel element operable to the e-beam mirror takes a logical value "1;" each e-beam mirror, when reflecting, exposes the area A to about the same amount of energy, E; and the exposure effect upon the area A is additive, then the total amount of exposure energy that the area A receives, $E_{total}$, can be expressed as follows:

$$E_{total}=(X \cdot P_{i,1}+Y \cdot P_{i,2}+Z \cdot P_{i,3}Q \cdot P_{i,4}) \cdot E \quad (1)$$

Therefore, by grouping various e-beam mirrors in each bank 210, 214, 218, and 222, and assigning a set of values to the pixel elements $P_{i,1}$, $P_{i,2}$, $P_{i,3}$, and $P_{i,4}$, the DPG 114a may expose the area A (corresponding to the pixel "i") to a desired energy dose (or intensity level). For example, if there are 4, 8, 16, and 32 e-beam mirrors in the banks 210, 214, 218, and 222 respectively, a pixel in the bit map 204 with pixel elements $P_{i,1}=1$, $P_{i,2}=0$, $P_{i,3}=1$, and $P_{i,4}=0$ exposes the corresponding area on the wafer 130 with about 20·E of e-beam energy.

Figure 3:
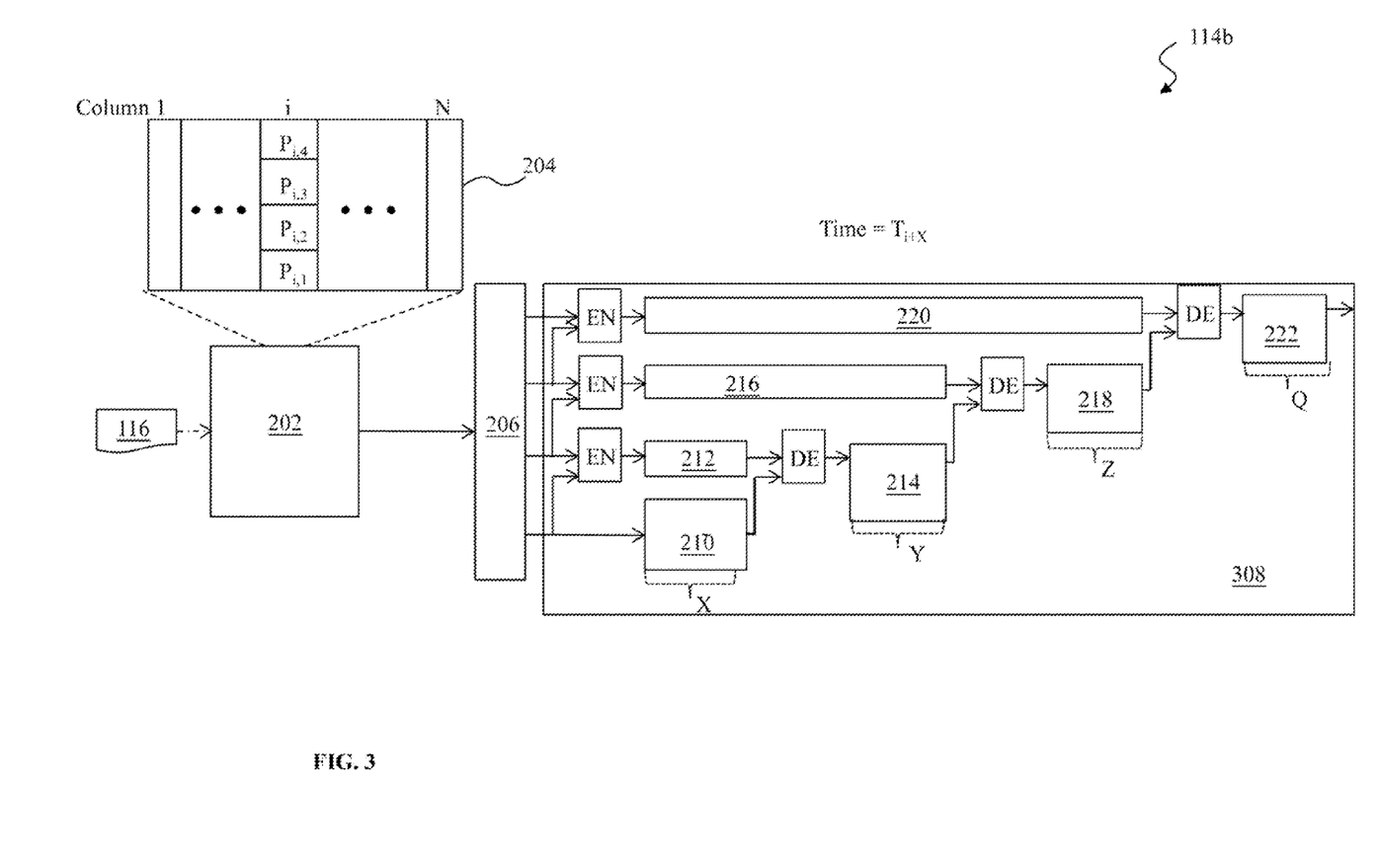
FIG. 3 shows an exemplary digital pattern generator in the e-beam lithography system of FIG. 1, in accordance with an embodiment.

FIG. 3 illustrates a portion of a DPG 114b, which is an embodiment of the DPG 114 (FIG. 1). The DPG 114b is similar to the DPG 114a. One difference is that the DPG 114b's mirror array 308 has encoders (EN) before and decoders (DE) after the delay lines 212, 216, and 220. Comparing the mirror arrays 208 (FIG. 2C) and 308 (FIG. 3), the mirror array 208 monitors the output from each of the four banks 210, 214, 218, and 222 for verification purpose, while the mirror array 308 monitors only the output from the bank 222 for verifying the proper operation of all four banks. Therefore, the mirror array 308 saves routing resources. The decoder logic is a reverse function of the encoder logic. For example, an "XOR" function may be used for both the decoders and encoders.

Figure 4A:
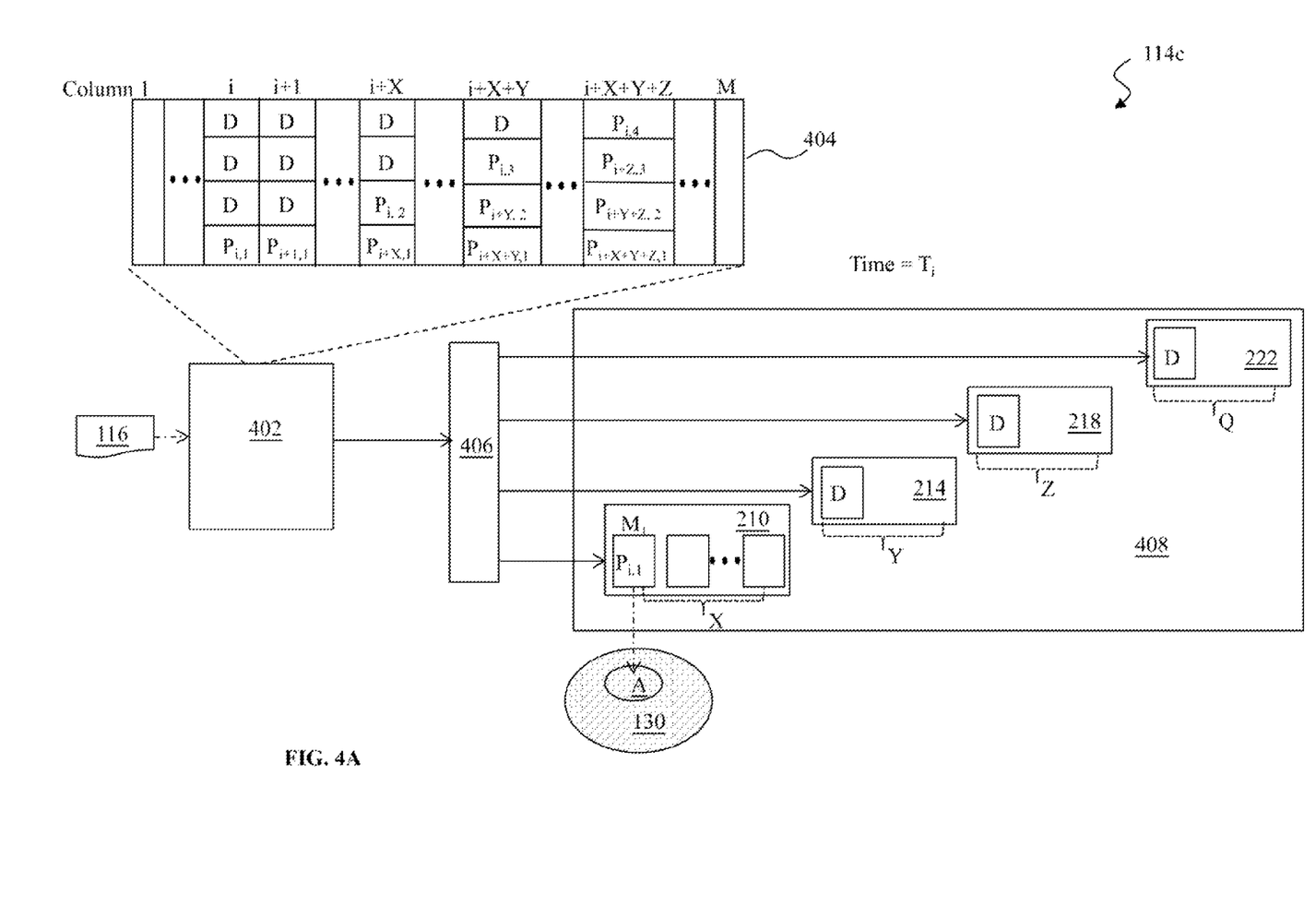
FIGS. 4A-4B show an exemplary digital pattern generator in the e-beam lithography system of FIG. 1, in accordance with an embodiment.

FIG. 4A illustrates a portion of a DPG 114c, which is an embodiment of the DPG 114 (FIG. 1), in the course of exposing the wafer 130 in response to the data file 116. Referring to FIG. 4A, the DPG 114c includes a control system 402, an interface 406 and a mirror array 408. The interface 406 is similar to the interface 206 of FIG. 2A. The control system 402 is similar to the control system 202 but it includes a bit map 404 organized differently from the bit map 204. In an embodiment, the bit map 404 is stored in one or more physical storage devices. Alternatively, it may be generated on-the-fly by the control system 402 in response to the data file 116. In an embodiment, the control system 402 converts a bit map organized like the bit map 204 to the bit map 404 right before it transfers the bits to the interface 406. Similar to the interface 206, the interface 406 passes the bits to the mirror array 408, one column per system cycle. The mirror array 408 includes the same four e-beam mirror banks 210, 214, 218, and 222. However, one difference is that the mirror array 408 does not include the delay elements 212, 216, and 220, resulting in reduction of hardware. Such hardware savings in the mirror array 408 provide many benefits for advanced semiconductor process nodes, such as 10 nm or below. As semiconductor process nodes continue to scale down, the e-beam mirrors are getting smaller and smaller, and there are more and more e-beam mirrors housed in a digital pattern generator. In an embodiment of the DPG 114, there are 4096 mirror arrays, such as the mirror array 208 or 408, and each mirror array has 7 banks of various number of e-beam mirrors, the reduction in hardware, by using a design similar to the mirror array 408, is tremendous. The savings in hardware also reduce routing congestion and power consumption of the mirror array 408, compared to the mirror array 208.

The hardware savings in the mirror array 408 may come at a cost in the control system 402. However, as will be discussed below, such cost is much smaller compared to the benefits the mirror array 408 provides.

Referring again to FIG. 4A, the bit map 404 provides 4 pixel elements per pixel, $P_i=(P_{i,1}, P_{i,2}, P_{i,3}, P_{i,4})$, similar to the bit map 204. But the 4 pixel elements do not reside in the same column in the bit map 404 as they do in the bit map 204. Instead, they are arranged in accordance with the configuration of the mirror array 408. Taking the pixel "i" as an example, its pixel elements $P_{i,1}$, $P_{i,2}$, $P_{i,3}$, and $P_{i,4}$ are in the columns i, i+X, i+X+Y, and i+X+Y+Z respectively. Also shown in FIG. 4A, there are 3 dummy bits in the column i besides $P_{i,1}$. A dummy bit does not print images on the wafer 130. For the sake of example, a dummy bit is denoted "D" (Dummy). However, one with ordinary skill in the art should appreciate that for a given column in the bit map 404, there may or may not be any dummy bits. For example, in the column labeled "i+X+Y+Z," all four pixel elements are part of some pixels, not dummy bits. Compared with the bit map 204, the bit map 404 has (X+Y+Z) more columns. However, these extra columns usually constitute a very small percentage of the total number of columns M. In an embodiment, the bit map 404 is stored in a storage device, such as an on-chip storage device, a stand-alone storage device, a network storage device, a floppy disk, CD-ROM, DVD-ROM, or any other form of computer-readable medium. A small increase in the size of the bit map 404 is commonly acceptable and can be obtained cost effectively. In another embodiment, the bit map 404 is only transitory in that the physically-stored bit map is the same as the bit map 204 and the control system 402 converts the bit map 204 to the bit map 404 by inserting dummy bits and re-arranging the pixel elements right before it transfers the bits to the interface 406. In this regard, the cost of implementing the bit map 404 is the extra processing cycles and the associated processing hardware in the control system 402. In any case, since the mirror array 408 is probably a more valuable asset than the control system 402, the aforementioned hardware savings in the mirror array 408 outweighs the aforementioned extra cost in the control system 402.

Referring again to FIG. 4A, the control system 402 delivers one or more columns of bits from the bit map 404 to the interface 406 and the interface 406 in turn delivers four bits per system cycle to the four banks, 210, 214, 218, and 222. At system cycle "i" (time $T_i$), the pixel element $P_{i,1}$ reaches the e-beam mirror, $M_1$, in the bank 210, while the dummy bits D reach the first e-beam mirrors in the banks 214, 218, and 222. The dummy bits D take logical values that cause an e-beam mirror to absorb, rather than reflect, the e-beam 110 (FIG. 1). FIG. 4A also shows that the wafer 130 is aligned with the mirror array 408 at the time $T_i$. Particularly, the area A of the wafer 130 is aligned with the e-beam mirror, $M_1$. The area A is either exposed to the e-beam 110 (FIG. 1) or not, depending on the logical value of the pixel element $P_{i,1}$ as discussed above.

Figure 4B:
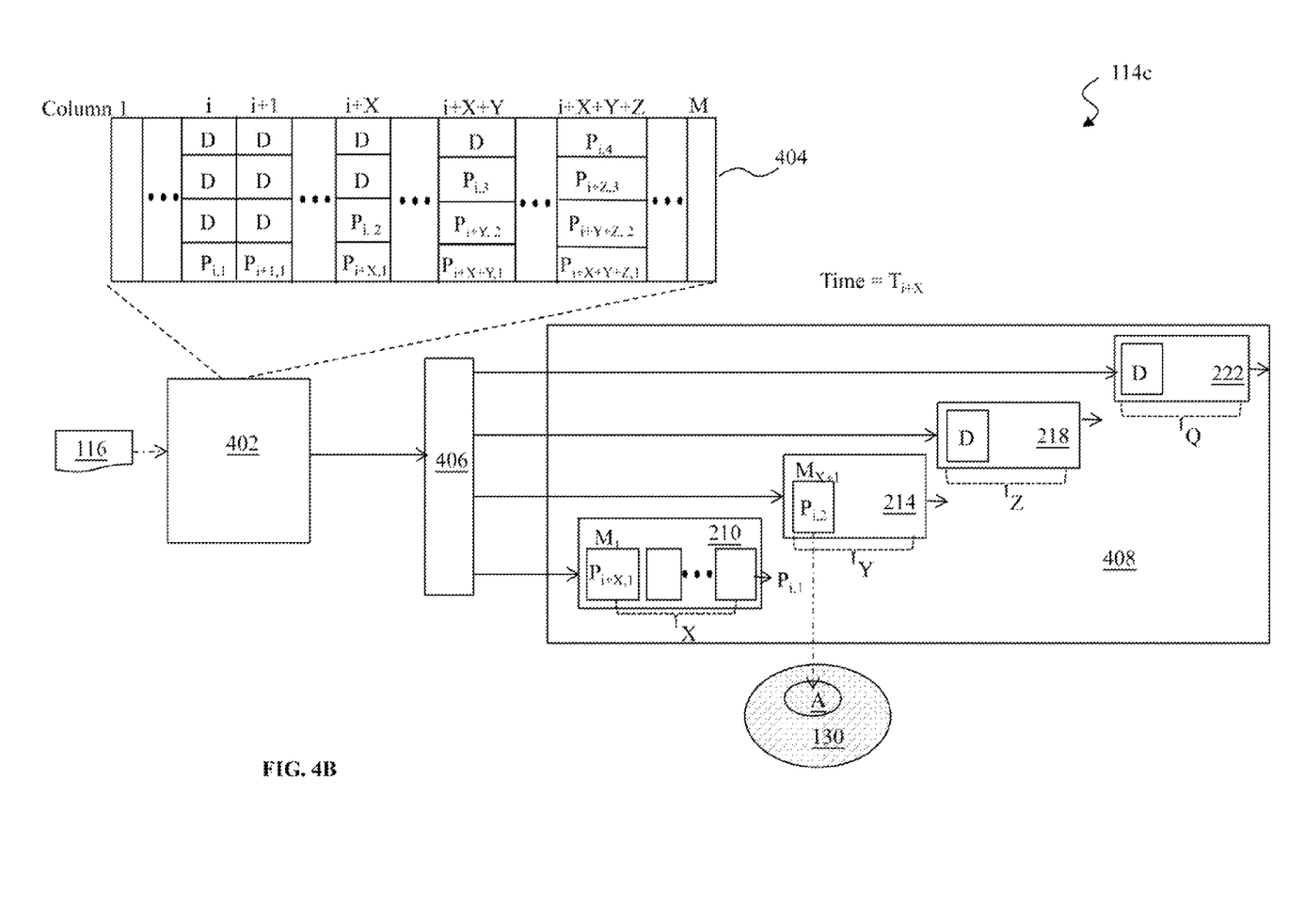

Referring to FIG. 4B, at the system cycle "i+X" (time= $T_{i+X}$), the interface 406 delivers the column "i+X" of the bit map 404, which contains the pixel element $P_{i,2}$, to the mirror array 408. The pixel element $P_{i,2}$ reaches the e-beam mirror $M_{X+1}$ in the bank 214, while the pixel element $P_{i,1}$ has finished traversing all e-beam mirrors in the bank 210 and is optionally used to monitor the integrity of the DPG 114c. The wafer 130 moves in a "lock" step with the pixel "i," with the area A presently aligned with the e-beam mirror $M_{X+1}$. The area A is either exposed to the e-beam 110 (FIG. 1) or not, depending on the logical value of the pixel element $P_{i,2}$ as discussed above. Also shown in FIG. 4B, a pixel element $P_{i+X,1}$ is shifted into the e-beam mirror $M_1$ at the system cycle "i+X." This may be the first pixel element of the pixel "i+X." The aforementioned steps are repeated until the pixel element $P_{i,4}$ is delivered from the bit map 404 to the bank 222 and then traverses the e-beam mirrors in the bank 222.

Figure 5:
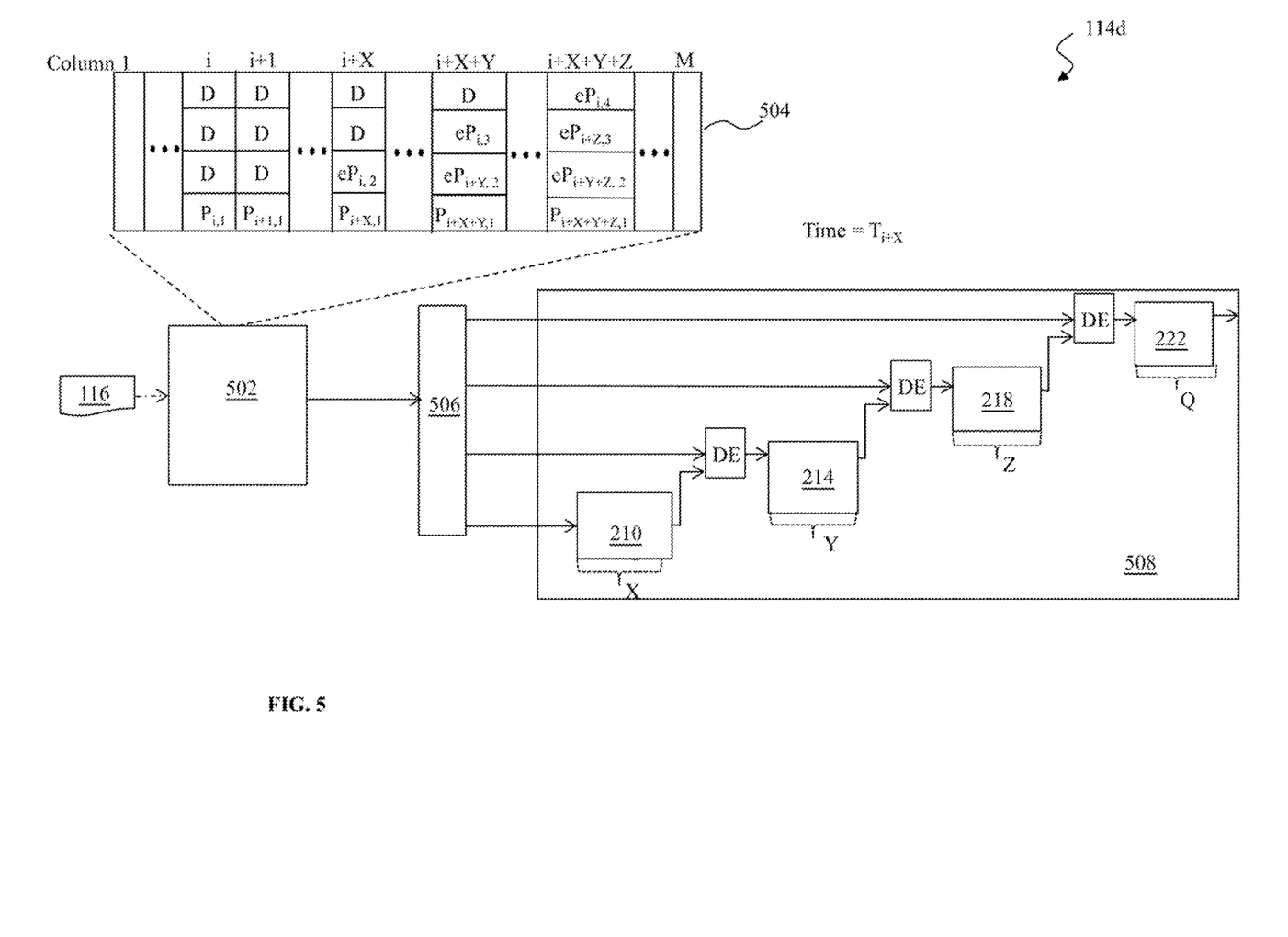
FIG. 5 shows an exemplary digital pattern generator in the e-beam lithography system of FIG. 1, in accordance with an embodiment.

FIG. 5 illustrates a portion of a DPG 114d, which is an embodiment of the DPG 114 (FIG. 1). The DPG 114d is similar to the DPG 114c. One difference is that the DPG 114d's mirror array 508 has decoders (DE) before each of the mirror banks 214, 218, and 222. Another difference is that the DPG 114d's control system 502 includes (or generates) a bit map 504 which is slightly different from the bit map 404 (FIG. 4B). Comparing the mirror arrays 408 (FIG. 4B) and 508 (FIG. 5), the mirror array 408 monitors the output from each of the four banks 210, 214, 218, and 222 for verification purpose, while the mirror array 508 monitors only the output from the bank 222 for verifying the proper shift operation of all four banks. Therefore, the mirror array 508 saves routing resources. In one embodiment, the decoder logic is an "XOR" between a pixel element and the next pixel element in a pixel's ordered set. To implement the mirror array 508, the bit map 504 includes encoded pixel elements. For example, a pixel element "$eP_{i,2}$" in the column "i+X" is an XOR of the pixel elements $P_{i,1}$ and $P_{i,2}$, a pixel element "$eP_{i,3}$" in the column "i+X+Y" is an XOR of the pixel elements $P_{i,2}$ and $P_{i,3}$, and so on.

Figure 6A:
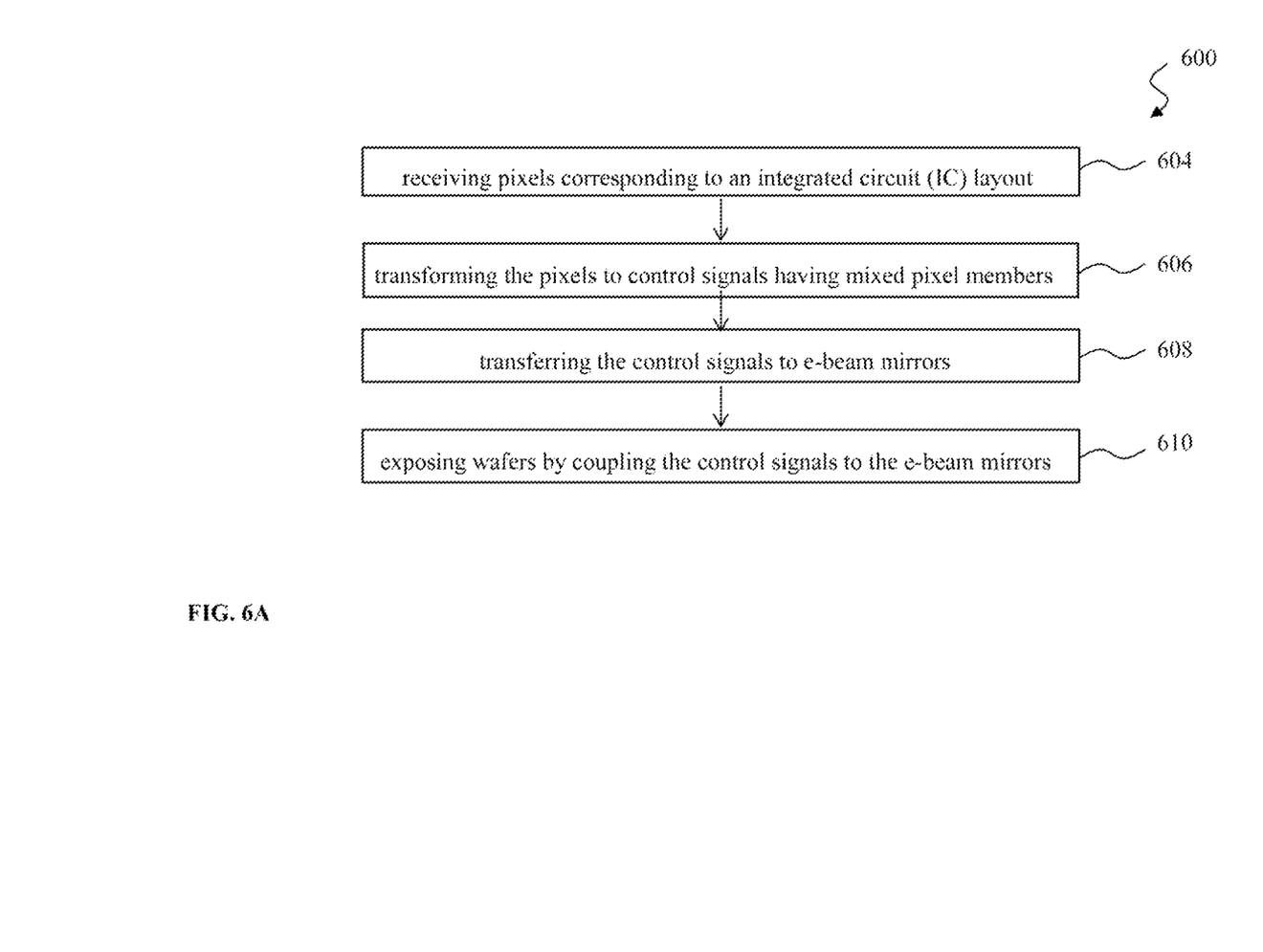
FIG. 6A shows a method of manufacturing wafers according to various aspects of the present disclosure.

FIG. 6A illustrates a method 600 of exposing a wafer using the e-beam system 100 (FIG. 1) according to various aspects of the present disclosure.

At operation 604, the method 600 receives a first plurality of pixels through the data file 116 (FIG. 1). The pixels correspond to a portion of an IC layout and each of the pixels has multiple pixel members that will collectively expose a portion of the wafer. In an embodiment, the pixels are organized like the bit map 204 (FIG. 2A). In an embodiment, the pixels are presented in a computer-readable medium.

At operation 606, the method 600 transforms the first plurality of pixels to a second plurality of control signals by rearranging the pixel members and introducing dummy bits. Each of the control signals has multiple bits. The control signals are organized like the bit map 404 (FIG. 4A). In an embodiment, the transformation is performed in a control unit of the DPG 114 of the system 100, such as the control system 402 (FIG. 4A). In an embodiment, the method 600 applies a first function to some of the pixel members before they are assigned to one or more of the control signals. The first function may be used for verification purposes. One of such examples has been described above in reference to FIG. 5.

At operation 608, the method 600 transfers the control signals to e-beam mirrors of the DPG 114 of the system 100, such as the mirror array 408 (FIG. 4A). In an embodiment, the control signals are transferred at a predetermined throughput.

At operation 610, the method 600 exposes the wafer by coupling the control signals to the e-beam mirrors. In an embodiment, the method 600 shifts the control signals through the e-beam mirrors. As a control signal is coupled to one or more e-beam mirrors, the wafer is moved synchronously for exposure. One of such wafer exposing examples has been described above in reference to FIGS. 4A and 4B.

Figure 6B:
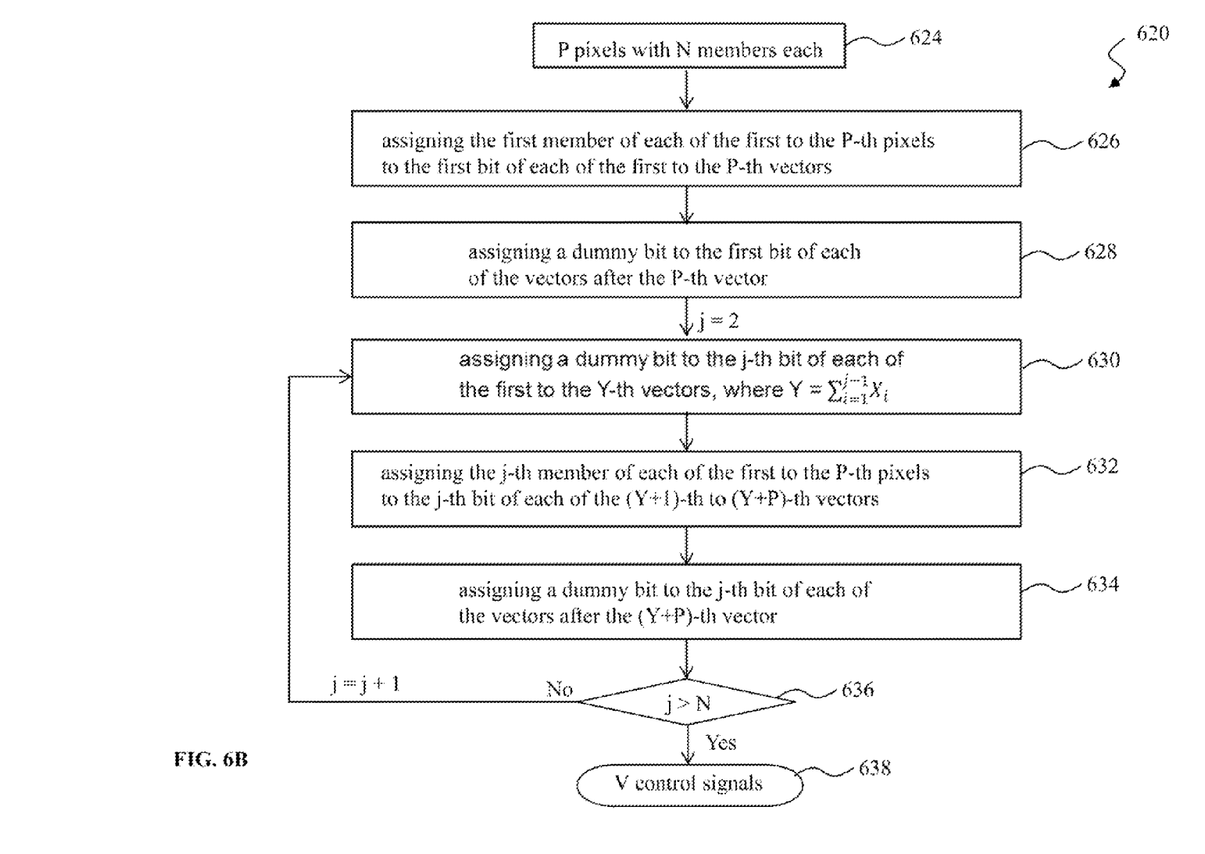
FIG. 6B shows a method of transforming a sequence of pixels to a sequence of control signals in an embodiment of a digital pattern generator.

FIG. 6B illustrates a method 620 of transforming a sequence of P pixels organized like the bit map 204 (FIG. 2A) to a sequence of V control signals organized like the bit map 404 (FIG. 4A) or 504 (FIG. 5). In an embodiment, the method 620 is included in the operation 606 (FIG. 6A). The method 620 will be described in conjunction with the FIGS. 2A and 4A. The method 620 is implemented in a control system such as the control system 406 (or 506) to provide the sequence of control signals to a mirror array such as the mirror array 408 (or 508). For the sake of simplicity, each of the P pixels has N members, and is expressed with an order set $P_i=(P_{i,1}, P_{i,2}, \ldots, P_{i,N})$, where $1 \leq i \leq P$; and each of the V control signals has N members, and is expressed with an order set $V_i=(V_{i,1}, V_{i,2}, \ldots V_{i,N})$, where $1 \leq i \leq V$;

The method 620 (FIG. 6) receives the P pixels at operation 624.

At operation 626, the method 620 assigns the first member of each of the P pixels to the first bit of each of the first P control signals, in a one-to-one mapping:

$$V_{i,1}=P_{i,1}, \text{ where } 1 \leq i \leq P \qquad (1)$$

At operation 628, the method 620 assigns a dummy bit to the first bit of each of the control signals after the P-th control signal:

$$V_{i,1}=\text{Dummy, where } P+1 \leq i \leq V \qquad (2)$$

The method 620 performs operations 630, 632, and 634 to assign the second bit (j=2) of each of the V control signals.

At the operation 630, the method 620 assigns a dummy bit to the second bit of each of the first Y control signals, where Y equals the number of mirrors, $X_1$, in a mirror bank to which the first bit of each control signal is sent to, such as the mirror bank 210 (FIG. 4A):

$$Y=X_1 \qquad (3)$$

$$V_{i,2}=\text{Dummy, where } 1 \leq i \leq Y \qquad (4)$$

At the operation 632, the method 630 assigns the second member of each of the P pixels to the second bit of each of the P control signals after the first Y control signals:

$$V_{i,2}=P_{i-Y,2}, \text{ where } Y+1 \leq i \leq Y+P \qquad (5)$$

At the operation 634, the method 620 assigns a dummy bit to the second bit of each of the control signals after the (Y+P)-th control signal.

$$V_{i,2}=\text{Dummy, where } Y+P+1\leq i\leq V \qquad (6)$$

The method 620 repeats the operations 630, 632, and 634 to assign the other bits (j=3, 4, . . . N) in each of the V control signals. At each iteration, let $X_1$ denote the number of mirrors in the mirror bank where the i-th bit of a control signal is sent to, Y is expressed as follows:

$$Y=\Sigma_{i=1}^{j-1}X_i \qquad (7)$$

With each iteration, the equations (4), (5) and (6) are used to assign the corresponding bits in the V control signals.

At operation 638, all the bits of the V control signals have been fully assigned.

In an embodiment, the method 620 generates one control signal per system cycle. For example, an index "i" can be used to keep track of which control signal is being generated. The above equations (1)-(7) can be used to assign each of the N bits of this i-th control signal per system cycle. Once all N bits of the i-th control signal have been assigned, a control system, such as the control system 402 (FIG. 4A), sends the i-th control signal to a mirror array, such as the mirror array 408 (FIG. 4A). This process repeats for each system cycle until all V control signals have been generated and delivered to the mirror array. In an embodiment, the control system 402 includes storage elements. When a portion of a pixel has not been assigned to a control signal, the pixel or the portion thereof is stored in the storage element until all members of the pixel have been assigned to some control signals. Afterwards, the pixel may be removed from the storage element.

In an embodiment, where a mirror array includes decoders (e.g., XOR), such as the mirror array 508 (FIG. 5), the method 620 encodes the second through the N-th member of a pixel before it assigns the member to the control signals. For example, the equation (5) can be replaced with (the "^" is an XOR operator):

$$V_{i,j}=P_{i-Y,j}{}^{\wedge}P_{i-Y,j-1} \text{ where } Y+1\leq i\leq Y+P, 2\leq j\leq N \qquad (8)$$

Figure 7:
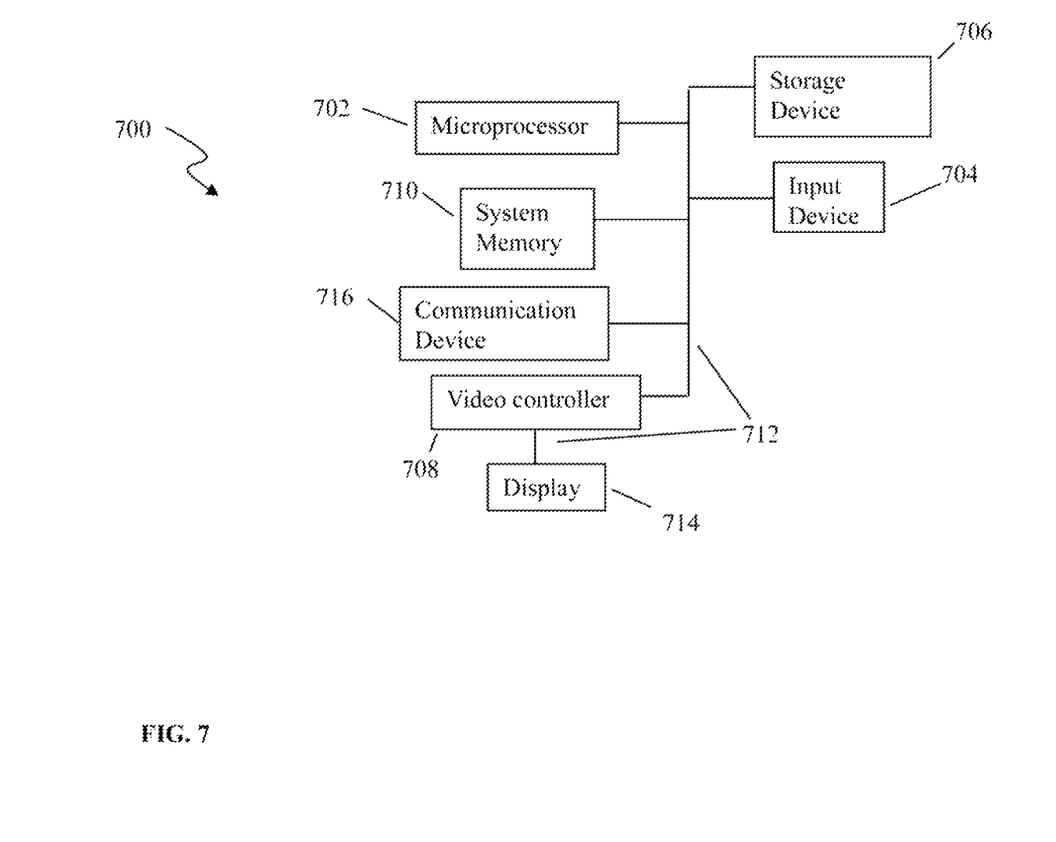
FIG. 7 is an illustration of a computer system for implementing one or more embodiments of the present disclosure.

FIG. 7 illustrates a computer system 700 as an embodiment of the control system 402 (FIG. 4A). The computer system 700 includes a microprocessor 702, an input device 704, a storage device 706, a video controller 708, a system memory 710, a display 714, and a communication device 716, all interconnected by one or more buses 712. The storage device 706 could be a floppy drive, hard drive, CD-ROM, optical drive, or any other form of storage device. In addition, the storage device 706 may be capable of receiving a floppy disk, CD-ROM, DVD-ROM, or any other forms of computer-readable medium that may contain computer-executable instructions. Furthermore, communication device 716 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, and cell phones.

The bit map 404 may be housed in the system memory 710, in the storage device 706, or in another storage device (not shown) which is accessible by the communication device 716. In an embodiment, the computer system 700 has access to the bit map 204 (FIG. 2A) and generates the bit map 404 (FIG. 4A) by the microprocessor 702 using an embodiment of the method 620 (FIG. 6). In an embodiment, the microprocessor 702 is a general purpose microprocessor. Alternatively, the microprocessor 702 is a dedicated hardware platform, such as a field programmable gate array (FPGA) or an application specific integrated circuit (ASIC).

A computer system, such as the computer system 700, typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example. Further, hardware may include any physical device that is capable of storing machine-readable instructions, such as memory or other data storage devices. Other forms of hardware include hardware sub-systems, including transfer devices such as modems, modem cards, ports, and port cards, for example, and processing devices such as a field programmable gate array (FPGA), an application specific integrated circuit (ASIC), for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet. Note that more than one database may be implemented.

The foregoing outlines features of several embodiments so that those with ordinary skill in the art may better understand the aspects of the present disclosure. Those with ordinary skill in the art should appreciate that they may readily use the present disclosure as a basis for designing or modifying other processes and structures for carrying out the same purposes and/or achieving the same advantages of the embodiments introduced herein. Those with ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a method of manufacturing a wafer with an integrated circuit (IC) layout. The method includes receiving a first plurality of pixels, wherein each of the pixels corresponds to a portion of the IC layout and includes data members. The method further includes transforming the first plurality of pixels into a second plurality of control signals, wherein at least some of the control signals include both a data member of one of the pixels and another data member of another one of the pixels. The method further includes transferring the control signals to a third plurality of mirrors, wherein the mirrors conditionally reflect an energy beam incident thereupon when coupled with the control signals.

In another exemplary aspect, the present disclosure is directed to a method of exposing a wafer in an electron beam (e-beam) direct writing system having a first and a second mirror banks and each of the mirror banks having e-beam mirrors. The method includes receiving a first pixel, wherein the first pixel includes a first member and a second member, and the first pixel corresponds to a first portion of the wafer. The method further includes storing the second member in a storage element, and transmitting the first member to the first mirror bank and a dummy data to the second mirror bank, wherein the dummy data does not cause the e-beam mirrors of the second mirror bank to reflect an e-beam incident thereupon. The method further includes exposing the first portion with the first mirror bank.

In another exemplary aspect, the present disclosure is directed to a system comprising an energy source, a mirror array, a storage element, and a control element. The energy source is configured to generate an energy beam. The mirror array includes a first mirror bank and a second mirror bank, and each of the first and the second mirror banks includes mirrors that are operable to conditionally reflect the energy beam. The storage element is configured to store pixels and each of the pixels includes a first member and a second member and corresponds to a portion of an integrated circuit (IC) layout. The control element is coupled between the storage element and the mirror array, and the control element is configured to send a first data to the first mirror bank and a second data to the second mirror bank per a predetermined interval, wherein the first data is a first member of a first pixel, and the second data is one of: a second member of a second pixel and a dummy data that does not cause the mirrors to reflect the energy beam.

What is claimed is:

1. A method of manufacturing a substrate, the method comprising the steps of:

receiving a plurality of pixel elements, wherein each of the pixel elements includes data members;

generating a control bit map by rearranging the data members and introducing dummy data for delay in the control bit map, and by encoding a data member with another data member of a same pixel element to place encoded data members into the control bit map;

transferring the data members, encoded data members, and the dummy data to a plurality of electron beam (e-beam) mirrors according to the control bit map, wherein each data member, encoded data member, and dummy data are to be coupled with more than one e-beam mirrors in series and the dummy data do not cause the e-beam mirrors to expose the substrate, wherein different data members and encoded data members of one pixel element are transferred at different system cycles; and exposing the substrate with the e-beam mirrors and the data members and the encoded data members.

2. The method of claim 1, further comprising the step of:
coupling the data members to the e-beam mirrors before the step of exposing the substrate.

3. The method of claim 2, wherein:
the e-beam mirrors are divided into a plurality of banks wherein the number of banks equal to the number of data members in a pixel element; and
each data member is coupled to all e-beam mirrors in a respective bank in a serial fashion.

4. The method of claim 3, wherein the step of exposing the substrate includes:
aligning the substrate with the e-beam mirrors such that data members of one pixel element cause a common portion of the substrate to be exposed.

5. The method of claim 3, wherein the step of transferring includes:
transmitting a data member to one of the banks and a dummy data to another one of the banks in one system cycle, wherein the dummy data does not cause the e-beam mirrors to expose the substrate.

6. The method of claim 1, further comprising:
monitoring an output of the plurality of e-beam mirrors for verification purposes.

7. A method of exposing a wafer, comprising the steps of:
receiving a first pixel element, wherein the first pixel element includes first and second members and corresponds to a first portion of the wafer;
generating a control bit map by assigning the first member to a first plurality of electron beam (e-beam) mirrors and assigning a dummy data and an encoded second member to a second plurality of e-beam mirrors, wherein the dummy data is to be coupled to the second plurality when the first member is coupled to the first plurality, the encoded second member is an XOR of the first and second members, and wherein the encoded second member is to be coupled to the second plurality after the first member has been coupled to all members of the first plurality;
storing the control bit map in a storage element;
transmitting the first member to the first plurality of electron beam (e-beam) mirrors and the dummy data and the encoded second member to the second plurality of e-beam mirrors according to the control bit map; and
exposing the first portion with the first plurality.

8. The method of claim 7, wherein the transmitting of the dummy data includes coupling the dummy data to the second plurality of e-beam mirrors and causing no action of the second plurality of e-beam mirrors.

9. The method of claim 7, wherein the exposing of the first portion includes the steps of:
aligning the first portion with one of the first plurality; and
coupling the first member with the one of the first plurality.

10. The method of claim 9, further comprising:
repeating the aligning and coupling steps until the first member is coupled to each of the first plurality.

11. The method of claim 7, further comprising the steps of:
repeating the receiving, generating, storing, transmitting, and exposing steps for X pixel elements, wherein X equals the number of e-beam mirrors of the first plurality;
receiving a second pixel element, wherein the second pixel element includes a third member and a fourth member, and the second pixel element corresponds to a second portion of the wafer;
generating control data of the second pixel element in the control bit map;
storing the control data of the second pixel element in the storage element;
transmitting the third member to the first plurality and the dummy data and the encoded second member from the storage element to a second plurality of e-beam mirrors according to the control bit map; and
exposing the first portion of the wafer with the second plurality.

12. A system comprising:
first and second pluralities of electron beam (e-beam) mirrors, wherein each e-beam mirror is operable to conditionally expose a substrate with an incident e-beam; and
a control element, configured to generate a control bit map by assigning a first data to the first plurality and assigning dummy data and a second data to the second plurality, wherein the first data and the dummy data are coupled to the respective first and second pluralities at the same time per system cycle and the dummy data is used to maintain no action of the second plurality, and wherein:
the first data corresponds to a first member of a first pixel element that is to be coupled with each of the first plurality in series,
the second data is an XOR of the first data and a second member of the first pixel element that is to be coupled with each of the second plurality in series,
the first pixel element corresponds to portions of an integrated circuit (IC) layout.

13. The system of claim 12, further comprising:
a storage element, configured to store the control bit map before they are sent by the control element.

14. The system of claim 12, further comprising:
a decoder, configured to recover the second member of the first pixel element from the first and second data.

15. The system of claim 12, further comprising:
a verification element, configured to monitor an output from the first plurality for verifying operations of both the first and the second pluralities.

16. The method of claim 1, wherein all data members in a pixel element cause the e-beam mirrors to expose a same spot on the substrate.

17. The system of claim 12, wherein the first pixel element further includes a third data, wherein the first and third data cause the first and second pluralities to expose a same spot on the substrate.

18. The method of claim 1, wherein the encoding of the data member with another data member of the same pixel element comprises XOR of the data member with the another data member of the same pixel element.

19. The method of claim 1, further comprising, after the transferring and before the exposing:
decoding the encoded data members to obtain decoded data members; and
coupling the decoded data members to the e-beam mirrors.

20. The method of claim 7, further comprising:
monitoring an output from the second plurality of e-beam mirrors to verify operations of both the first and the second pluralities of e-beam mirrors.

* * * * *